(12) United States Patent
Lee et al.

(10) Patent No.: US 10,032,705 B2
(45) Date of Patent: Jul. 24, 2018

(54) SEMICONDUCTOR PACKAGE AND MANUFACTURING METHOD THEREOF

(71) Applicant: Amkor Technology, Inc., Tempe, AZ (US)

(72) Inventors: Jae Ung Lee, Seoul (KR); Yung Woo Lee, Anyang-si (KR); EunNaRa Cho, Seoul (KR); Dong Hyun Bang, Seoul (KR); Wook Choi, Seoul (KR); KooWoong Jeong, Seoul (KR); Byong Jin Kim, Bucheon-si (KR); Min Chul Shin, Bucheon-si (KR); Ho Jeong Lim, Seoul (KR); Ji Hyun Kim, Seoul (KR); Chang Hun Kim, Seoul (KR)

(73) Assignee: Amkor Technology, Inc., Temp, AZ (US)

( * ) Notice: Subject to any disclaimer, the term of this patent is extended or adjusted under 35 U.S.C. 154(b) by 0 days.

(21) Appl. No.: 15/149,141

(22) Filed: May 8, 2016

(65) Prior Publication Data
US 2017/0018493 A1    Jan. 19, 2017

(30) Foreign Application Priority Data

Jul. 13, 2015   (KR) .......................... 10-2015-0099070

(51) Int. Cl.
*H01L 23/52*   (2006.01)
*H01L 23/498*   (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 23/49822* (2013.01); *H01L 23/49827* (2013.01); *H01L 23/5389* (2013.01); *H01L 25/16* (2013.01); *H01L 23/3128* (2013.01); *H01L 24/13* (2013.01); *H01L 24/16* (2013.01); *H01L 25/0655* (2013.01); *H01L 2224/0401* (2013.01);
(Continued)

(58) Field of Classification Search
None
See application file for complete search history.

(56) References Cited

U.S. PATENT DOCUMENTS

2002/0140085 A1*  10/2002  Lee .................. H01L 23/52
                                                     257/724
2006/0120058 A1*  6/2006  Fairchild ........... H01L 23/13
                                                     361/761

(Continued)

*Primary Examiner* — Shaun Campbell
(74) *Attorney, Agent, or Firm* — McAndrews, Held & Malloy, Ltd.

(57) ABSTRACT

A semiconductor package and a method of manufacturing a semiconductor package. As a non-limiting example, various aspects of this disclosure provide a semiconductor package, and method of manufacturing thereof, that comprises a substrate having a first surface and a second surface opposite to the first surface, and comprising at least one first recess portion formed in a direction ranging from the first surface toward the second surface, a plurality of first recess conductive patterns formed in the first recess portion, and a first passive element inserted into the first recess portion of the substrate and having a first electrode and a second electrode electrically connected to the plurality of first recess conductive patterns.

18 Claims, 18 Drawing Sheets

(51) Int. Cl.
   H01L 23/538   (2006.01)
   H01L 21/48    (2006.01)
   H01L 25/16    (2006.01)
   H01L 23/31        (2006.01)
   H01L 23/00        (2006.01)
   H01L 25/065       (2006.01)

(52) U.S. Cl.
   CPC .................. *H01L 2224/131* (2013.01); *H01L 2224/13147* (2013.01); *H01L 2224/16227* (2013.01); *H01L 2224/16235* (2013.01); *H01L 2224/16237* (2013.01); *H01L 2924/1432* (2013.01); *H01L 2924/1434* (2013.01); *H01L 2924/15159* (2013.01); *H01L 2924/19041* (2013.01); *H01L 2924/19042* (2013.01); *H01L 2924/19043* (2013.01); *H01L 2924/19103* (2013.01); *H01L 2924/19106* (2013.01)

(56) References Cited

U.S. PATENT DOCUMENTS

2010/0078797 A1*  4/2010  McConnelee ....... H01L 21/4857
                                                      257/690
2013/0118791 A1*  5/2013  Okamoto ................ H05K 1/186
                                                      174/260
2014/0218884 A1*  8/2014  Sakai ................ H01L 23/49822
                                                      361/762

* cited by examiner

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0099070 filed on Jul. 13, 2015, in the Korean Intellectual Property Office and titled "SEMICONDUCTOR PACKAGE," the contents of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
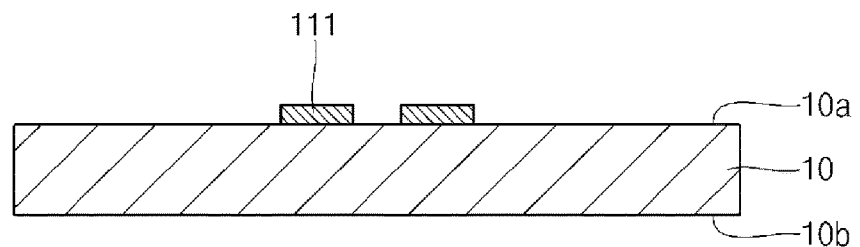
FIGS. 1A to 1D are cross-sectional views sequentially illustrating a manufacturing method of a semiconductor package according to an embodiment of the present disclosure.

Various aspects of this disclosure provide a semiconductor package and a method of manufacturing a semiconductor package. As a non-limiting example, various aspects of this disclosure provide a semiconductor package, and method of manufacturing thereof, that comprises a substrate having a first surface and a second surface opposite to the first surface, and comprising at least one first recess portion formed in a direction ranging from the first surface toward the second surface, a plurality of first recess conductive patterns formed in the first recess portion, and a first passive element inserted into the first recess portion of the substrate and having a first electrode and a second electrode electrically connected to the plurality of first recess conductive patterns.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

The present disclosure relates to a semiconductor package, and a method of manufacturing thereof, which can reduce the overall thickness of the semiconductor package by inserting a passive element into a recess portion provided on a substrate.

In general, a plurality of active elements and passive elements are mounted on a planar surface of a substrate including a plurality of semiconductor dies. In addition, a common passive element generally has a larger thickness than an active element. Therefore, when a plurality of active elements and passive elements are mounted on a planar surface, the overall thickness of a semiconductor package may increase due to the passive elements. In addition, since a passive element has a limited capacity, it is necessary to newly develop the passive element to reduce its thickness.

Various example embodiments of the present disclosure provide a semiconductor package.

According to an aspect of the present disclosure, there is provided a semiconductor package, and manufacturing method thereof including a substrate having a first surface and a second surface opposite to the first surface and including at least one first recess portion formed in a direction ranging from the first surface to the second surface and a plurality of first recess conductive patterns formed in the first recess portion, and a first passive element inserted into the first recess portion of the substrate and having a first electrode and a second electrode electrically connected to the plurality of first recess conductive patterns.

According to another aspect of the present disclosure, there is provided a semiconductor package, and manufacturing method thereof, including a substrate having a first surface and a second surface opposite to the first surface and including at least one second recess portion formed in a direction ranging from the second surface to the first surface and a plurality of second recess conductive patterns formed in the second recess portion, and a second passive element inserted into the second recess portion of the substrate and having a first electrode and a second electrode electrically connected to the plurality of second recess conductive patterns, wherein the substrate further includes a dielectric layer having the second recess portion formed in a direction from the second surface to the first surface, a first conductive pattern exposed to the first surface of the dielectric layer, a second conductive pattern exposed to the second surface of the dielectric layer, and a conductive via electrically connecting the first conductive pattern and the second conductive pattern while passing through the dielectric layer.

As described above, the semiconductor package according to one embodiment of the present disclosure can reduce the overall thickness of the semiconductor package by inserting a passive element into a recess portion provided on a substrate The above and other aspects of the present disclosure will be described in or be apparent from the following description of various example implementations. Various aspects of the present disclosure will now be presented with reference to accompanying drawings.

Referring to FIGS. 1A to 1D, cross-sectional views sequentially illustrating a manufacturing method of a semiconductor package according to an embodiment of the present disclosure are illustrated.

As illustrated in FIGS. 1A to 1D, the manufacturing method of a semiconductor package according to an embodiment of the present disclosure may include forming a plurality of first recess conductive patterns 111 on a core substrate 10, forming a first insulation dam 112 to surround the plurality of first recess conductive patterns 111, forming a first insulation layer 113 to fill an exterior side of the first insulation dam 112 and to cover a first surface 10a of the core substrate 10 and preparing a substrate 110, and mounting a first passive element 120 to be electrically connected to the first recess conductive patterns 111. In the preparing of the substrate 110, the forming of the first insulation dam 112 and the forming of the first insulation layer 113 may be alternately repeated one time to five times or more. The manufacturing method of a semiconductor package according to an embodiment of the present disclosure will now be described in more detail with reference to FIGS. 1A to 1D.

As illustrated in FIG. 1A, in the forming of the plurality of first recess conductive patterns 111 on the core substrate 10, the plurality of first recess conductive patterns 111 are formed on a first surface 10a of the core substrate 10 shaped of a plate having the first surface 10a that is planar and a second surface 10b that is planar and is opposite to the first surface 10a. The first recess conductive patterns 111 may be formed at positions corresponding to a region on which the first passive element 120 is to be mounted. The plurality of first recess conductive patterns 111 may include two first recess conductive patterns, which form a set, to be connected to a first electrode 121 and a second electrode 122 of the first passive element 120, respectively. In order to allow a plurality of first passive elements 120 to be mounted on the first surface 10a of the core substrate 10, the plurality of first recess conductive patterns 111, each two of which form a set, may be provided on the core substrate 10. The core substrate 10 includes conductive patterns exposed to the first surface 10a and conductive patterns exposed to the second surface 10b, and may be a printed circuit board having conductive vias electrically connecting the conductive patterns formed on the first surface 10a and the second surface 10b while passing through the first surface 10a and the second surface 10b. Here, the first recess conductive patterns 111 may be formed at the same when the conductive patterns provided on the core substrate 10. The first recess conductive patterns 111 may be generally made of one selected from the group consisting of copper, aluminum, and equivalents thereof, but the scope of this disclosure is not limited thereto.

Figure 1B:
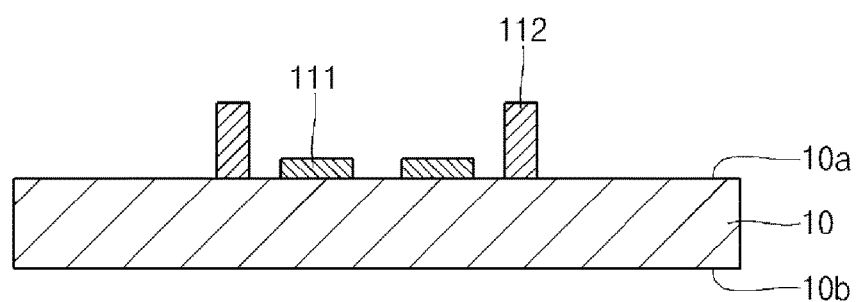

As illustrated in FIG. 1B, in the forming of the first insulation dam 112 to surround the plurality of first recess conductive patterns 111, the first insulation dam 112 spaced apart from each of the first recess conductive patterns 111 on the first surface 10a of the core substrate 10 and having a predetermined height to create a space on a region having the first recess conductive patterns 111 is formed. Here, the first insulation dam 112 is formed on the first surface 10a of the core substrate 10 to surround the first recess conductive patterns 111. That is to say, the first insulation dam 112 is configured such that the two first recess conductive patterns 111 to be connected to the respective electrodes of the first passive element 120 are separated from the exterior side of the first surface 10a of the core substrate 10. The first insulation dam 112 may be made of a solder resist, but aspects of the present disclosure are not limited thereto.

Figure 1C:
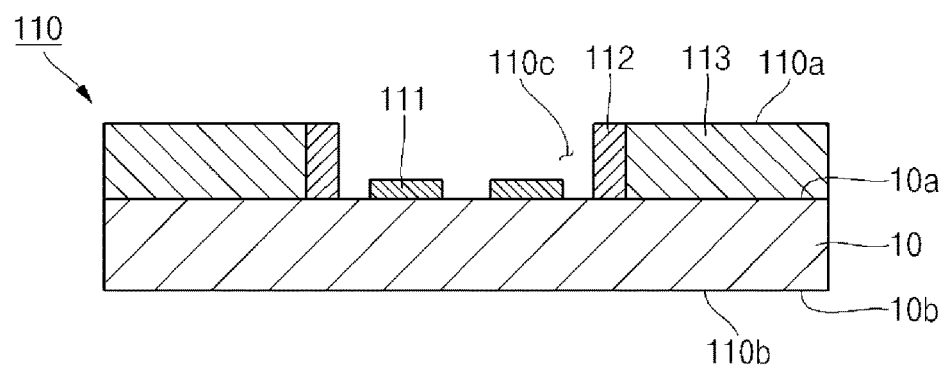

As illustrated in FIG. 1C, in the preparing of the substrate 110, the substrate 110 is prepared by forming a first insulation layer 113 to cover the exterior side of the first insulation dam 112 on the first surface 10a of the core substrate 10. That is to say, the first insulation layer 113 is formed to entirely cover the first surface 10a of the core substrate 10 in the exterior side of the first insulation dam 112 on the first surface 10a of the core substrate 10. The first insulation layer 113 may be formed to have the same height with the first insulation dam 112. The first insulation layer 113 may be made of a semi-curable resin or a prepreg, but aspects of the present disclosure are not limited thereto. The first insulation dam 112 may prevent the first insulation layer 113 in a semi-cured state from covering the first recess conductive patterns 111 at the time of forming the first insulation layer 113. In addition, the forming of the first insulation dam 112 and the forming of the first insulation layer 113 may be alternately repeated one time to five times, or more. While the first insulation dam 112 and the first insulation layer 113, which are single layers, are illustrated in the present disclosure, they may be formed of multiple layers according to the height of the first passive element 120.

As described above, the substrate 110 may be formed using the manufacturing method of the semiconductor package illustrated in FIGS. 1A to 1C. The substrate 110 may include at least one first recess portion 110c formed in a direction ranging from the first surface 110a to the second surface 110b. The first recess portion 110c is a region where the first recess conductive patterns 111 are formed and may correspond to an interior region formed by the first insulation dam 112. The first recess portion 110c may include a plurality of first recess portions to mount a plurality of first passive elements 120 on the substrate 110, but the present disclosure does not limit the number of first recess portions 110c.

Figure 1D:
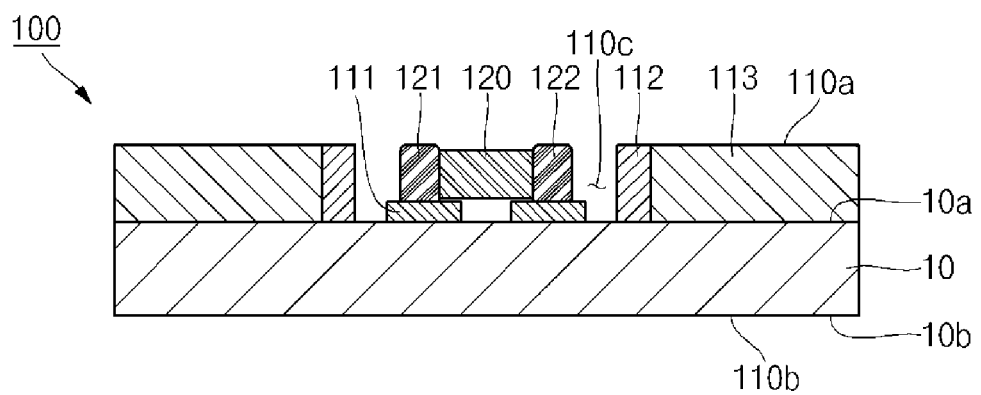

As illustrated in FIG. 1D, in the mounting of the first passive element 120, the first passive element 120 is mounted to be electrically connected to the first recess conductive patterns 111 provided in the first recess portion 110c of the substrate 110. The first passive element 120 may include a first electrode 121 and a second electrode 122 and may be electrically connected to the first recess conductive patterns 111. The first passive element 120 may include a resistor, a capacitor, an inductor, a connector, and the like, but aspects of the present disclosure are not limited thereto. The first passive element 120 is inserted into the first recess portion 110c, thereby preventing the overall thickness of the semiconductor package 100 from increasing.

Figure 2:
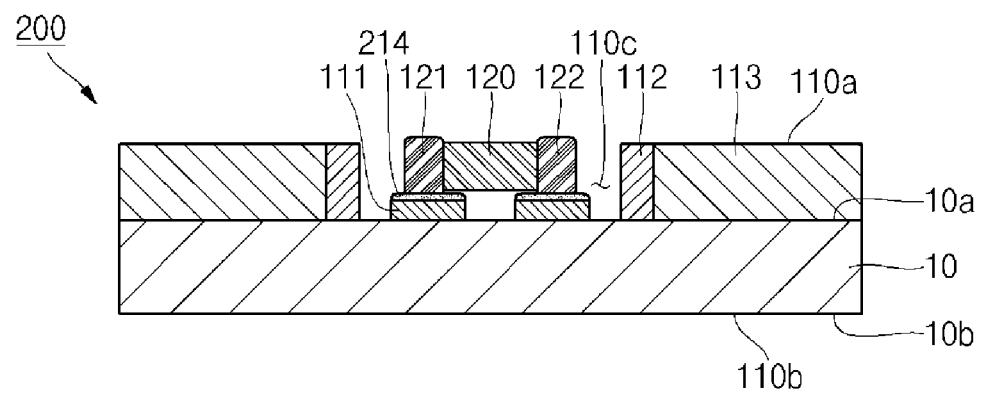
FIG. 2 is a cross-sectional view illustrating a semiconductor package according to another embodiment of the present disclosure.

Referring to FIG. 2, a cross-sectional view illustrating a semiconductor package according to another embodiment of the present disclosure is illustrated.

As illustrated in FIG. 2, the semiconductor package 200 includes a substrate 210 and a first passive element 120. In addition, the substrate 210 includes a core substrate 10, first recess conductive patterns 111, a first insulation dam 112, a first insulation layer 113 and a conductive layer 214. The core substrate 10 of the substrate 210, the first recess conductive patterns 111, the first insulation dam 112, the first insulation layer 113 and the first passive element 120 are the same as corresponding components of the semiconductor package 100 illustrated in FIG. 1D. The following description will focus on the conductive layer 214, which is a different feature of the semiconductor package 100 illustrated in FIG. 1D.

The conductive layer 214 may be formed to cover a first surface 111a of the first recess conductive patterns 111 after the first recess conductive patterns 111 are formed on the core substrate 10. The conductive layer 214 may be made of a solder. The conductive layer 214 may be interposed between the first electrode 121 of the first passive element 120 and the first recess conductive patterns 111 and between the second electrode 122 of the first passive element 120 and the first recess conductive patterns 111, respectively. The conductive layer 214 may facilitate connections of the first and second electrodes 121 and 122 of the first passive element 120 to the first recess conductive patterns 111. As shown in FIG. 2, a portion of the first passive element 120 may protrude from the first recess portion 110c.

Figure 3:
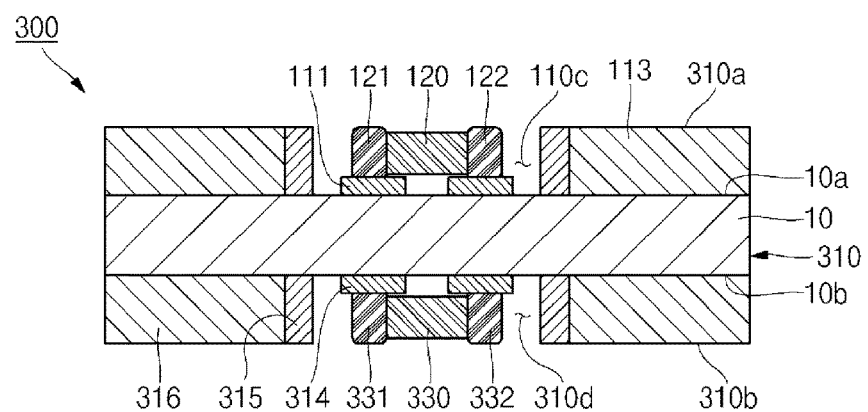
FIG. 3 is a cross-sectional view illustrating a semiconductor package according to still another embodiment of the present disclosure.

Referring to FIG. 3, a cross-sectional view illustrating a semiconductor package according to still another embodiment of the present disclosure is illustrated.

As illustrated in FIG. 3, the semiconductor package 300 includes a substrate 310, a first passive element 120, and a second passive element 330. In addition, the substrate 210 includes a core substrate 10, first recess conductive patterns 111, a first insulation dam 112, a first insulation layer 113, second recess conductive patterns 314, a second insulation dam 315 and a second insulation layer 316. The core substrate 10 of the substrate 310, the first recess conductive patterns 111, the first insulation dam 112, the first insulation layer 113 and the first passive element 120 are the same as corresponding components of the semiconductor package 100 illustrated in FIG. 1D. The following description will focus on the second recess conductive patterns 314, the second insulation dam 315, the second insulation layer 316 and the second passive element 330, which are different features of the semiconductor package 100 illustrated in FIG. 1D.

The second recess conductive patterns 314 may include a plurality of second recess conductive patterns formed on the second surface 10b of the core substrate 10 shaped of a plate. The second recess conductive patterns 314 may be formed at positions corresponding to a region on which the second passive element 330 is to be mounted. The plurality of second recess conductive patterns 314 may include a couple of second recess conductive patterns, which form a set, to be connected to a first electrode 331 and a second electrode 332 of the second passive element 330, respectively. In order to allow a plurality of second passive elements 330 to be mounted on the second surface 10b of the core substrate 10, the plurality of second recess conductive patterns 314, each two of which form a set, may be provided on the core substrate 10. Here, the second recess conductive patterns 314 may be electrically connected to conductive patterns provided on the core substrate 10. The second recess conductive patterns 314 may be generally made of one selected from the group consisting of copper, aluminum, and equivalents thereof, but the scope of this disclosure is not limited thereto. In addition, the second recess conductive patterns 314 may further include solders formed at ends thereof.

The second insulation dam 315 is spaced apart from the second recess conductive patterns 314 on the second surface 10b of the core substrate 10 and is formed to have a predetermined height to create a space in a region where the second recess conductive patterns 314 are provided. The second insulation dam 315 is formed to surround the second recess conductive patterns 314 on the second surface 10b of the core substrate 10. That is to say, the second insulation dam 315 configured such that two second recess conductive patterns 314 to be connected to the respective electrodes 331 and 332 of the second passive element 330 are separated from the exterior side of the second surface 10b of the core substrate 10. The second insulation dam 315 may be made of a solder resist, but aspects of the present disclosure are not limited thereto.

The second insulation layer 316 is formed to cover the exterior side of the second insulation dam 315 on the second surface 10b of the core substrate 10. That is to say, the second insulation layer 316 is formed to entirely cover the second surface 10b of the core substrate 10 in the exterior side of the second insulation dam 315 on the second surface 10b of the core substrate 10. The second insulation layer 316 may be formed to have the same height with the second insulation dam 315. The second insulation layer 316 may be made of a semi-curable resin or a prepreg, but aspects of the present disclosure are not limited thereto. The second insulation dam 315 may prevent the second insulation layer 316 in a semi-cured state from covering the second recess conductive patterns 314 at the time of forming the second insulation layer 316. In addition, the second insulation dam 315 and the second insulation layer 316 may be alternately repeatedly formed one time to five times, or more. While the second insulation dam 315 and the second insulation layer 316, which are single layers, are illustrated in the present disclosure, they may be formed of multiple layers according to the height of the second passive element 330.

The substrate 310 may include at least one first recess portion 110c formed in a direction ranging from the first surface 310a to the second surface 310b and at least one second recess portion 310d formed in a direction ranging from the second surface 310b to the first surface 310a. That is to say, the substrate 310 may include recess portions provided at opposite sides of the core substrate 10. The second recess portion 310d is a region where the second recess conductive patterns 314 are formed and may correspond to an interior region formed by the second insulation dam 315. The second recess portion 310d may include a plurality of second recess portions to mount a plurality of second passive elements 330 on the substrate 110, but the present disclosure does not limit the number of second recess portions 310d.

The second passive element 330 is mounted in the second recess portion 310d of the substrate 110 to be electrically connected to the second recess conductive patterns 314 provided in the second recess portion 310d in the substrate 310. The second passive element 330 may include a first electrode 331 and a second electrode 332 and may be electrically connected to the second recess conductive patterns 314. The second passive element 330 may include a resistor, a capacitor, an inductor, a connector, and the like, but aspects of the present disclosure are not limited thereto. The semiconductor configured such that the first passive element 120 and the second passive element 330 are inserted into the first recess portion 110c and the second recess portion 310d, thereby preventing the overall thickness of the semiconductor package 300 from increasing.

Referring to FIGS. 4A to 4M, cross-sectional views sequentially illustrating a manufacturing method of a semiconductor package according to another embodiment of the present disclosure are illustrated.

As illustrated in FIGS. 4A to 4M, the manufacturing method of a semiconductor package according to another embodiment of the present disclosure may include preparing a substrate 410, mounting a first passive element 120 to be electrically connected to first recess conductive patterns 415a provided in the first recess portion 410c of the substrate 410, encapsulating the semiconductor die 430 and the first passive element 120 to be covered by an encapsulant 440, and forming an external conductive bump 450 on a second conductive pattern 418 of the substrate 410.

The preparing of the substrate 410 is illustrated in FIGS. 4A to 4I. The preparing of the substrate 410 may include forming a seed layer 2 on a carrier 1, forming a first conductive pattern 411 and a dummy pattern 412 using the seed layer 2, forming a first dielectric layer 413 to cover the first conductive pattern 411 and the dummy pattern 412, forming a first conductive via 414 and a third conductive pattern 415 on the first dielectric layer 413, forming a second dielectric layer 416 to cover the first conductive via 414 and the third conductive pattern 415, forming a second conductive via 417 and a second conductive pattern 418 on the second dielectric layer 416, separating a carrier 1 from the seed layer 2, removing the seed layer 2 from the first dielectric layer 413, forming a protection layer 419 on the dielectric layers 413 and 416 to expose first and second conductive patterns 411 and 418, and removing the dummy pattern 412 from the first dielectric layer 413. While the substrate 410 is formed on one surface of the carrier 1 in the illustrated embodiment, it may be formed on one and the other surfaces of the carrier 1.

The substrate 410 may be formed by building up layers using the seed layers 2 formed on one and the other surfaces of the carrier 1 as starting layers. That is to say, the substrate 410 may be formed using the seed layers 2 formed on one and the other surfaces of the carrier 1 as starting layers. The following description will focus on the substrate 410 formed on one surface of the carrier 1. However, in accordance with various aspects of this disclosure the substrate 410 may also be formed on the other surface of the carrier 1 using the same manufacturing method.

Hereinafter, the manufacturing method of the semiconductor package 400 will be described in more detail with reference to FIGS. 4A to 4M.

Figure 4A:
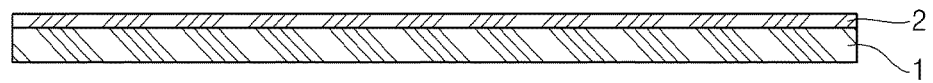
FIGS. 4A to 4M are cross-sectional views sequentially illustrating a manufacturing method of a semiconductor package according to another embodiment of the present disclosure.

In the forming of the seed layer 2 on the carrier 1 illustrated in FIG. 4A, the seed layer 2 made of a conductive material is formed to cover one surface of the carrier 1 shaped of a plate (or wafer or panel). The seed layer 2 may be formed to have the uniform thickness so as to cover one surface of the carrier 1. The seed layer 2 may be a copper layer, a titanium layer or a titanium tungsten layer, but aspects of the present disclosure are not limited thereto. In addition, the carrier 1 may be generally made of one selected from the group consisting of copper, core, stainless steel, glass, silicon, a dummy wafer, ceramic, sapphire, quartz, and equivalents thereof, but aspects of the present disclosure are not limited thereto.

Figure 4B:
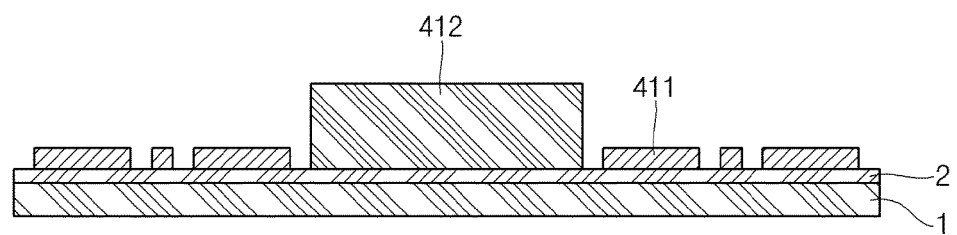

In the forming of the first conductive pattern 411 and the dummy pattern 412 using the seed layer 2 illustrated in FIG. 4B, a mask pattern (not shown) is formed to partially cover the seed layer 2, followed by performing electroplating on the seed layer 2 exposed to the outside through the mask pattern, thereby forming the first conductive pattern 411. In addition, at the time of forming the first conductive pattern 411, the dummy pattern 412 may also be formed by electroplating the seed layer 2. Here, the dummy pattern 412 may be formed to have a greater thickness than the first conductive pattern 411. Then, after the first conductive pattern 411 and the dummy pattern 412 are formed, the mask pattern is removed. The first conductive pattern 411 and the dummy pattern 412 may be made of copper (Cu), but aspects of the present disclosure are not limited thereto.

Figure 4C:
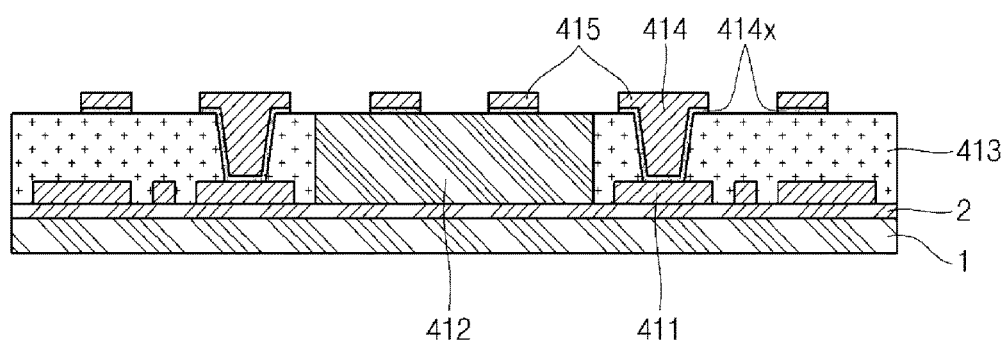

In the forming of the first dielectric layer 413 to cover the first conductive pattern 411 and the dummy pattern 412 illustrated in FIG. 4C, the first dielectric layer 413 may be formed and the first conductive via 414 and the third conductive pattern 415 may further be formed on the first dielectric layer 413. The first dielectric layer 413 may be formed to have a predetermined thickness enough to entirely cover the first conductive pattern 411 and the dummy pattern 412 formed on the seed layer 2. The first dielectric layer 413 may electrically protect the first conductive pattern 411 and the dummy pattern 412. The first dielectric layer 413 may be made of one or more selected from the group consisting of a prepreg, a build-up film, a silicon oxide layer, a silicon nitride layer, and equivalents thereof, but aspects of the present disclosure are not limited thereto. In addition, a via hole may be formed to expose the first conductive pattern 411 to the outside while passing through the first dielectric layer 413, the first conductive via 414 may further be formed to fill at least a portion of the via hole, and the third conductive pattern 415 may then be further formed on the first dielectric layer 413 to be electrically connected to the first conductive via 414. The first conductive via 414 electrically connects the first conductive pattern 411 formed on one surface of the first dielectric layer 413 and the third conductive pattern 415 formed on the other surface of the first dielectric layer 413 while passing through the first dielectric layer 413. The first conductive via 414 may be formed by forming a seed layer 414x to entirely cover the first conductive pattern 411 exposed to the outside through the via hole of the first dielectric layer 413 and sidewalls of the via hole and then performing electroplating on the seed layer 414x. The third conductive pattern 415 may be formed by forming the seed layer 414x on the first dielectric layer 413 and then performing electroplating on the seed layer 414x. In addition, the third conductive pattern 415 electrically connected to the first conductive via 414 may also be formed to partially extend along the exposed surface of the first dielectric layer 413 at the time of forming the first conductive via 414 through electroplating. That is to say, the seed layer 414x may be interposed between the first conductive via 414 and the first dielectric layer 413 and between the third conductive pattern 415 and the first dielectric layer 413. In addition, at least one third conductive pattern 415 is formed on the dummy pattern 412. The third conductive pattern 415 formed on the dummy pattern 412 becomes the first recess conductive patterns 415a provided in the recess portion of the substrate 410.

Figure 4D:
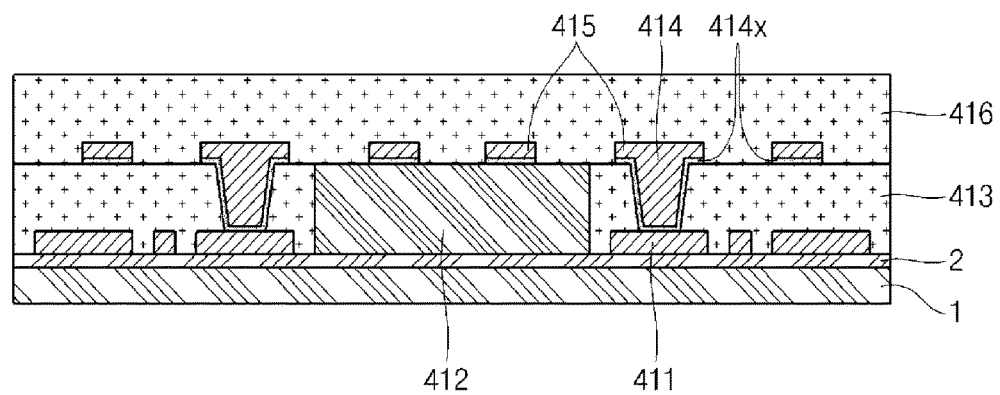

In the forming of the second dielectric layer 416 to cover the first conductive via 414 and the third conductive pattern 415 illustrated in FIG. 4D, the second dielectric layer 416 having a predetermined thickness enough to entirely cover the first conductive via 414, the third conductive pattern 415 and the first dielectric layer 413. The second dielectric layer 416 may electrically protect the first conductive via 414 and the third conductive pattern 415. The second dielectric layer 416 may be made of one or more selected from the group consisting of a prepreg, a build-up film, a silicon oxide layer, a silicon nitride layer, and equivalents thereof, but aspects of the present disclosure are not limited thereto.

Figure 4E:
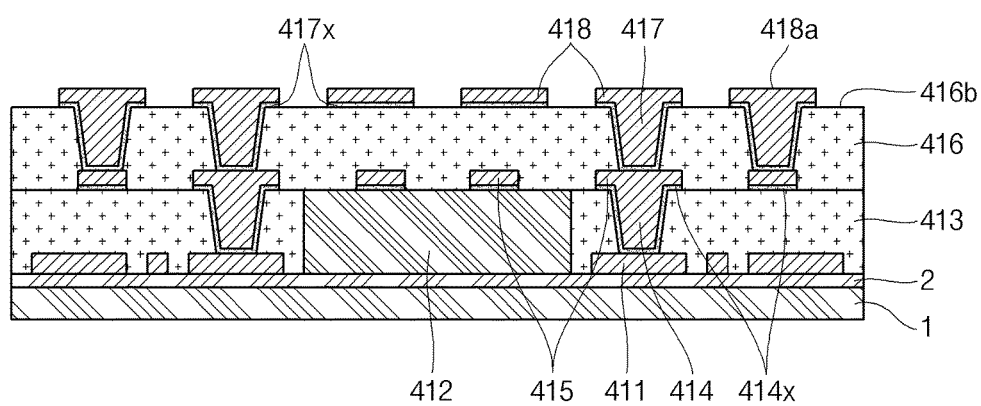

In the forming of the second conductive via 417 and the second conductive pattern 418 illustrated in FIG. 4E, a via hole is formed to expose the third conductive pattern 415 to the outside while passing through the second dielectric layer 416, the second conductive via 417 is further formed to fill at least a portion of the via hole, and the second conductive pattern 418 is then formed on the second dielectric layer 416 to be electrically connected to the second conductive via 417. The second conductive via 417 electrically connects the third conductive pattern 415 formed on one surface of the second dielectric layer 416 and the second conductive pattern 418 formed on the other surface of the second dielectric layer 416 while passing through the second dielectric layer 416. The second conductive via 417 may be formed by forming a seed layer 417x to entirely cover the third conductive pattern 415 exposed to the outside through the via hole of the second dielectric layer 416 and sidewalls of the via hole and then performing electroplating on the seed layer 417x. The second conductive pattern 418 may be formed by forming the seed layer 417x on the second dielectric layer 416 and then performing electroplating on the seed layer 417x. In addition, the second conductive pattern 418 electrically connected to the second conductive via 417 may also be formed to partially extend along the exposed surface of the second dielectric layer 416 at the time of forming the second conductive via 417 through electroplating. That is to say, the seed layer 417x may be interposed between the second conductive via 417 and the second dielectric layer 416 and between the second conductive pattern 418 and the second dielectric layer 416.

Figure 4F:
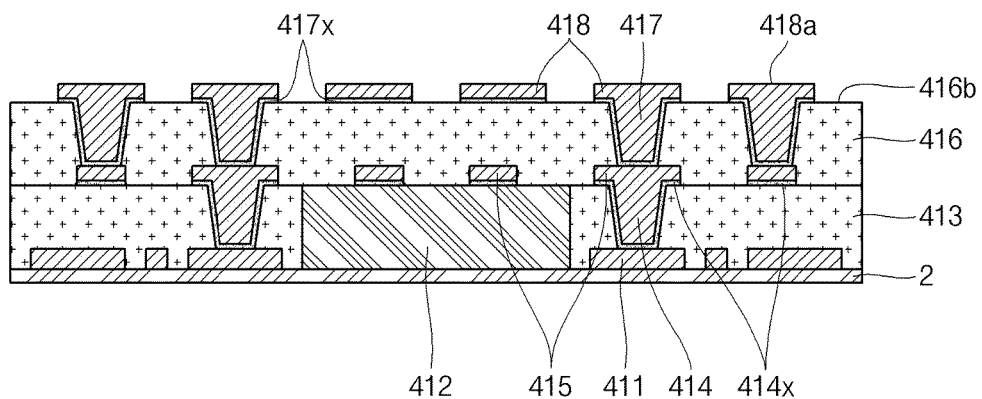

In the separating the carrier 1 from the seed layer 2 illustrated in FIG. 4F, the carrier 1 is separated from the seed layer 2 to expose the seed layer 2 to the outside. The carrier 1 is removed by general grinding and/or chemical etching or by UV or laser releasing, but aspects of the present disclosure are not limited thereto.

Figure 4G:
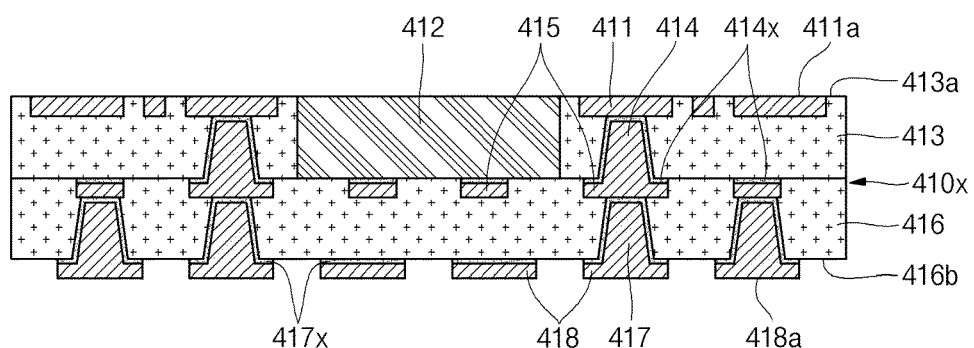

In the removing of the seed layer 2 from the first dielectric layer 413 illustrated in FIG. 4G, the substrate 410x from which the carrier 1 is separated is flipped and the seed layer 2 is then removed from the first dielectric layer 413, thereby exposing the first conductive pattern 411, the first dielectric layer 413 and the dummy pattern 412 to the outside. A first surface 413a of the first dielectric layer 413 and a first surface 411a of the first conductive pattern 411, which are exposed to the outside, may be coplanarly positioned (or coplanar). In addition, the second conductive pattern 418 formed on the second surface 416b of the second dielectric layer 416 may protrude from the second surface 416b of the second dielectric layer 416 on the substrate 410x. The seed layer 2 may be removed by general grinding and/or chemical etching, but aspects of the present disclosure are not limited thereto.

Figure 4H:
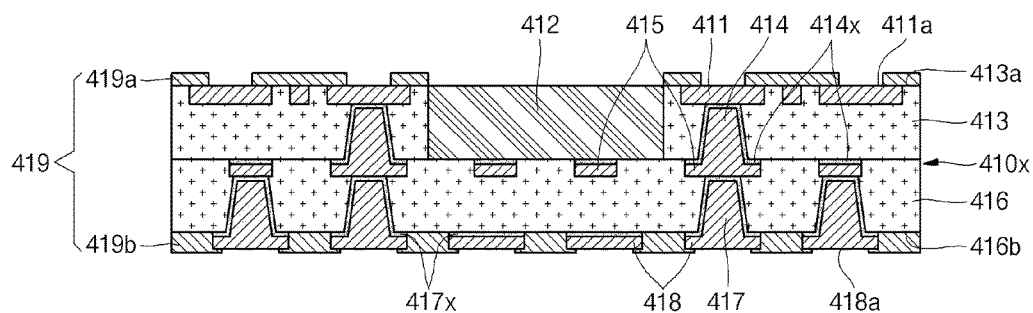

In the forming of the protection layer 419 on the dielectric layers 413 and 416 to expose the conductive patterns 411 and 418 illustrated in FIG. 4H, the protection layers 419a and 419b are formed on the first surface 413a of the first dielectric layer 413 and the second surface 416b of the second dielectric layer 416, respectively. The protection layers 419a and 419b are formed to expose the first conductive pattern 411 and a dummy pattern 412 exposed through the first surface 413a of the first dielectric layer 413 and the second conductive pattern 418 exposed through the second surface 416b of the second dielectric layer 416 to the outside. That is to say, the protection layers 419a and 419b are formed on the first surface 413a of the first dielectric layer 413 and the second surface 416b of the second dielectric layer 416, respectively, to expose the first conductive pattern 411, the dummy pattern 412 and the second conductive pattern 418 to the outside. The protection layers 419a and 419b may be made of a solder resist, but aspects of the present disclosure are not limited thereto.

Figure 4I:
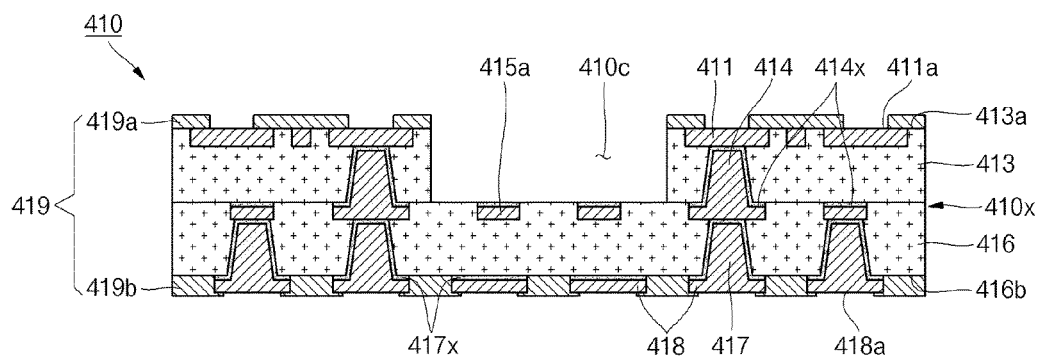

In the removing the dummy pattern 412 from the dielectric layer 413 illustrated in FIG. 4I, the dummy pattern 412 exposed to the outside while removing the seed layer 2 is removed, thereby forming the substrate 410 having the first recess portion 410c. The first recess conductive patterns 415a are exposed to the outside in the first recess portion 410c of the substrate 410 while removing the dummy pattern 412. The first recess conductive patterns 415a may be the third conductive patterns 415 formed in the dummy pattern 412 in the step illustrated in FIG. 4C. The dummy pattern 412 may be removed by etching, but aspects of the present disclosure are not limited thereto.

Figure 4J:
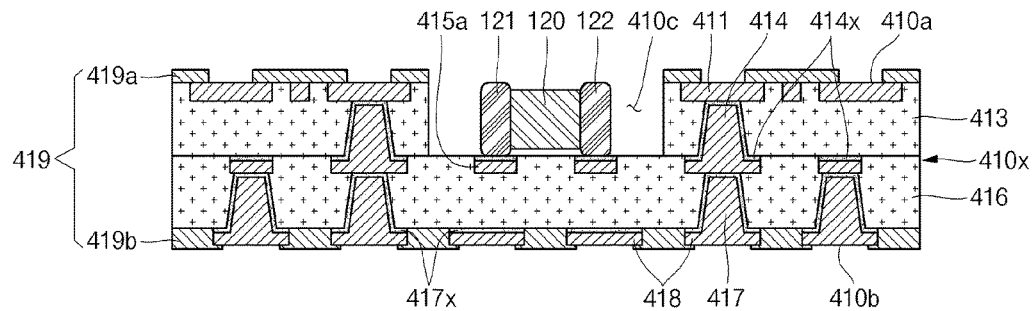

In the mounting the first passive element 120 on the substrate 410 illustrated in FIG. 4J, the first passive element 120 is mounted in the first recess portion 410c to be electrically connected to the first recess conductive patterns 415a provided in the first recess portion 410c. The first passive element 120 may include a first electrode 121 and a second electrode 122, which are electrically connected to the first recess conductive patterns 415a. The first passive element 120 may include a resistor, a capacitor, an inductor, a connector, and the like, but aspects of the present disclosure are not limited thereto. The first passive element 120 is inserted into the first recess portion 410c, thereby preventing the overall thickness of the semiconductor package 400 from increasing.

Figure 4K:
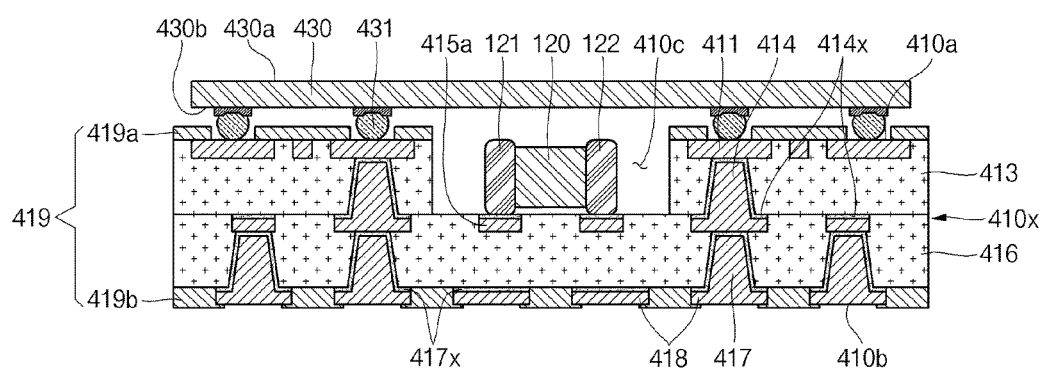

In the mounting of the semiconductor die 430 illustrated in FIG. 4K, the semiconductor die 430 is mounted on the first surface 410a of the substrate 410 to be electrically connected to the first conductive pattern 411 of the substrate 410. The semiconductor die 430 may be mounted on the first surface 410a of the substrate 410 to entirely cover the first passive element 120 and the first recess portion 410c. The semiconductor die 430 may be electrically connected to the first conductive pattern 411 by flip chip bonding, temperature compression (TC) bonding, temperature compression non-conductive paste (TCNCP) bonding or wire bonding. The semiconductor die 430 has a first surface 430a that is planar and a second surface 430b that is planar and is opposite to the first surface 430a, and a plurality of conductive bumps 431 are formed on the second surface 410b. The semiconductor die 430 is electrically connected to the first conductive pattern 411 through the plurality of conductive bumps 431. The conductive bump 431 may include a conductive pillar, copper pillar, a conductive ball, a solder ball or a copper ball, but aspects of the present disclosure are not limited thereto. In addition, a plurality of bond pads in place of the plurality of conductive bumps 431 are provided on the first surface 430a of the semiconductor die 430, and the bond pads and first conductive patterns 411 may be electrically connected through conductive wires (not shown). The semiconductor die 430 may include a general memory, a graphics processing unit (GPU), a central processing unit (CPU) and equivalents thereof, but aspects of the present disclosure are not limited thereto.

Figure 4L:
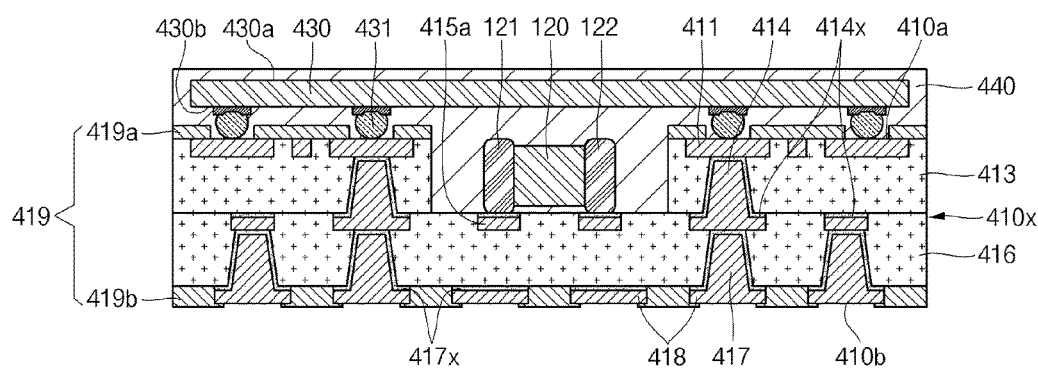

In the encapsulating illustrated in FIG. 4L, the encapsulating is performed to cover the first surface 410a of the substrate 410, the semiconductor die 430 and the first passive element 120 using the encapsulant 440. The encapsulant 440 may electrically protect the first surface 410a of the substrate 410, the first passive element 120 and the semiconductor die 430 from external circumstances.

Figure 4M:
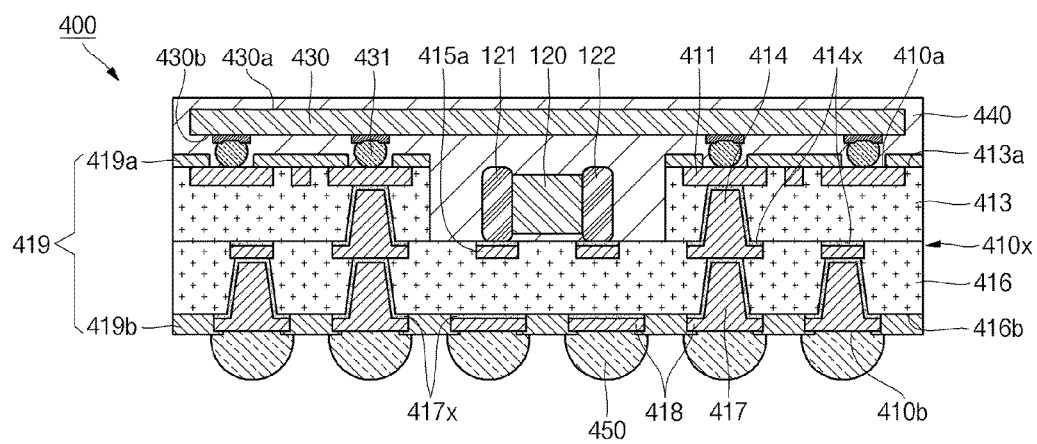

In the forming of the external conductive bump 450 illustrated in FIG. 4M, the second conductive pattern 418 exposed to the second surface 410b of the substrate 410, and the external conductive bump 450, are formed. The external conductive bump 450 is an input and/or output terminal to serve to mount the semiconductor package 400 on an external board of an electronic device. The external conductive bump 450 may include a conductive pillar, a copper pillar, a conductive ball, a solder ball or a copper ball, but aspects of the present disclosure are not limited thereto.

In the thus manufactured semiconductor package 400, the first passive element 120 is inserted into the first recess portion 410c of the substrate 410, thereby preventing the overall thickness of the semiconductor package 400 from increasing.

Figure 5:
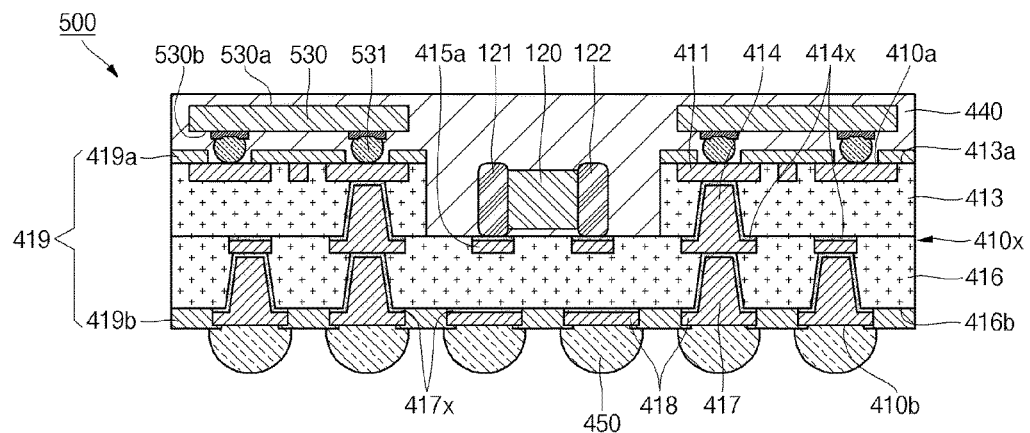
FIG. 5 is a cross-sectional view illustrating a semiconductor package according to still another embodiment of the present disclosure.

Referring to FIG. 5, a cross-sectional view illustrating a semiconductor package according to still another embodiment of the present disclosure is illustrated.

As illustrated in FIG. 5, the semiconductor package 500 includes a substrate 410, a first passive element 120, a semiconductor die 530, an encapsulant 440, and an external conductive bump 450. The substrate 410, the first passive element 120, the encapsulant 440 and the external conductive bump 450 are the same as corresponding components of the semiconductor package 400 illustrated in FIG. 4M. The following description will focus on the semiconductor die 530, which is a different feature of the semiconductor package 400 illustrated in FIG. 4M.

The semiconductor die 530 is mounted on the first surface 410a of the substrate 410 to be electrically connected to the first conductive pattern 411 of the substrate 410. The semiconductor die 530 may be formed on the first surface 410a of the substrate 410 so as not to cover the first passive element 120 and the first recess portion 410c. While two semiconductor dies 530 are mounted on the substrate 410 in FIG. 5, one semiconductor die 530 or one or more semiconductor dies 530 may be mounted on the substrate 410, but aspects of the present disclosure are not limited thereto. The semiconductor die 530 may be mounted on the first conductive pattern 411 by flip chip bonding, temperature compression (TC) bonding, or temperature compression non-conductive paste (TCNCP) bonding, but the scope of the present disclosure is not limited thereto. The semiconductor die 530 may include a plurality of conductive bumps 531. The semiconductor die 530 is electrically connected to the first conductive pattern 411 through the plurality of conductive bumps 531. The conductive bumps 531 may include a conductive pillar, copper pillar, a conductive ball, a solder ball or a copper ball, but aspects of the present disclosure are not limited thereto. The semiconductor die 530 may include a general memory, a graphics processing unit (GPU), a central processing unit (CPU) and equivalents thereof, but aspects of the present disclosure are not limited thereto.

Referring to FIGS. 6A to 6M are cross-sectional views sequentially illustrating a manufacturing method of a semiconductor package according to an embodiment of the present disclosure are illustrated.

As illustrated in FIGS. 6A to 6M, the semiconductor package according to still another embodiment of the present disclosure may include preparing a substrate 610, mounting a third passive element 330 to be electrically connected to second recess conductive patterns 615a provided in the second recess portion 610c of the substrate 610, mounting a semiconductor die 430 to be electrically connected to first conductive pattern 611 of the substrate 610, encapsulating the semiconductor die 430 to be covered by an encapsulant 440, and forming an external conductive bump 450 on a second conductive pattern 618 of the substrate 610.

The preparing of the substrate 610 is illustrated in FIGS. 6A to 6I. The preparing of the substrate 610 may include forming a first conductive pattern 611 using a seed layer 2, forming a first dielectric layer 613 to cover the first conductive pattern 611, forming a first conductive via 614 and third conductive patterns 615 on the first dielectric layer 613, forming a dummy pattern 612 on the third conductive patterns 615, forming a second dielectric layer 616 to cover the dummy pattern 612, the first conductive via 614 and the third conductive patterns 615, forming a second conductive via 617 and a second conductive pattern 618 on the second dielectric layer 616, separating a carrier 1 from the seed layer 2, removing the seed layer 2 from the first dielectric layer 613, forming a protection layer 619 on the dielectric layers 613 and 616 to expose the first and second conductive patterns 611 and 618, and removing the dummy pattern 612 from the second dielectric layer 616.

Figure 6A:
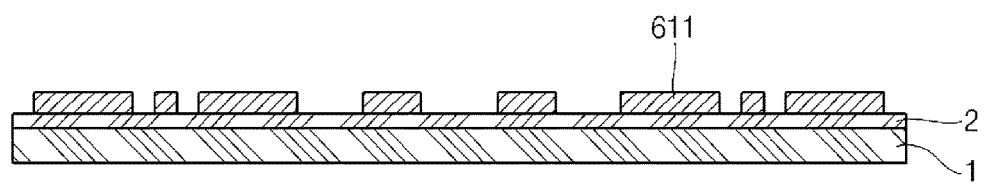
FIGS. 6A to 6M are cross-sectional views sequentially illustrating a manufacturing method of a semiconductor package according to an embodiment of the present disclosure.

In the preparing of the substrate 610, after forming the seed layer 2 on the carrier 1 illustrated in FIG. 4A, the first conductive pattern 611 illustrated in FIG. 6A is formed.

While the substrate 610 formed on one surface of the carrier 1 is illustrated, it may be formed on both of one and the other surfaces of the carrier 1. The substrate 610 may be formed by building up layers using the seed layers 2 formed on one and the other surfaces of the carrier 1 as starting layers. That is to say, the substrate 610 may be formed using the seed layers 2 formed on one and the other surfaces of the carrier 1 as starting layers. The following description will focus on the substrate 610 formed on one surface of the carrier 1. However, in accordance with various aspects of this disclosure, the substrate 610 may also be formed on the other surface of the carrier 1 using the same manufacturing method.

Hereinafter, the manufacturing method of the semiconductor package 600 will be described in more detail with reference to FIGS. 6A to 6M.

In the forming of the first conductive pattern 611 using the seed layer 2 illustrated in FIG. 6A, a mask pattern (not shown) is formed to partially cover the seed layer 2, followed by performing electroplating on the seed layer 2 exposed to the outside through the mask pattern, thereby forming the first conductive pattern 611 having the uniform thickness. After the first conductive pattern 611 is formed, the mask pattern is removed. The first conductive pattern 611 may be made of copper (Cu), but aspects of the present disclosure are not limited thereto.

Figure 6B:
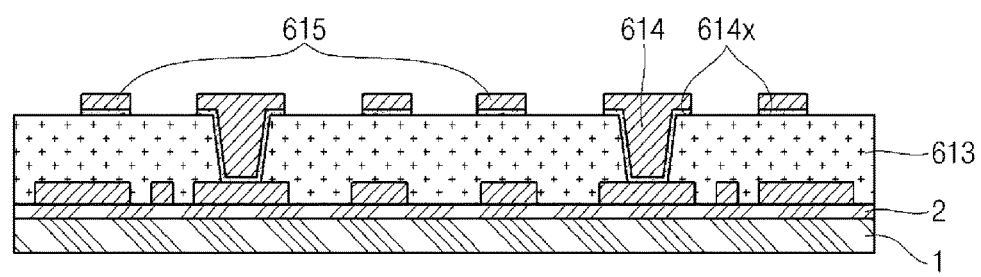

In the forming of the first dielectric layer 613 to cover the first conductive pattern 611 illustrated in FIG. 6B, the first dielectric layer 613 is formed and then the first conductive via 614 and the third conductive patterns 615 may further be formed on the first dielectric layer 613. The first dielectric layer 613 is formed to have a predetermined thickness enough to entirely cover the first conductive pattern 611 formed on the seed layer 2. The first dielectric layer 613 may electrically protect the first conductive pattern 611. The first dielectric layer 613 may be made of one selected from the group consisting of a prepreg, a build-up film, a silicon oxide layer, a silicon nitride layer, and equivalents thereof, but aspects of the present disclosure are not limited thereto. In addition, a via hole may be formed to expose the first conductive pattern 611 to the outside while passing through the first dielectric layer 613, the first conductive via 614 may further be formed to fill at least a portion of the via hole, and the third conductive patterns 615 may then be further formed on the first dielectric layer 613 to be electrically connected to the first conductive via 614. The first conductive via 614 electrically connects the first conductive pattern 611 formed on one surface of the first dielectric layer 613 and the third conductive patterns 615 formed on the other surface of the first dielectric layer 613 while passing through the first dielectric layer 613. The first conductive via 614 may be formed by forming a seed layer 614x to entirely cover the first conductive pattern 611 exposed to the outside through the via hole of the first dielectric layer 613 and sidewalls of the via hole and then performing electroplating on the seed layer 614x. The third conductive patterns 615 may be formed by forming a seed layer 614x on the first dielectric layer 613 and then performing electroplating on the seed layer 614x. In addition, the third conductive patterns 615 electrically connected to the first conductive via 614 may also be formed to partially extend along the exposed surface of the first dielectric layer 613 at the time of forming the first conductive via 614 through electroplating. That is to say, the seed layer 614x may be interposed between the first conductive via 614 and the first dielectric layer 613 and between the third conductive patterns 615 and the first dielectric layer 613. The seed layer 614x may surround a region between the first conductive pattern 611 and the first conductive via 614 and sidewalls of the first conductive via 614.

Figure 6C:
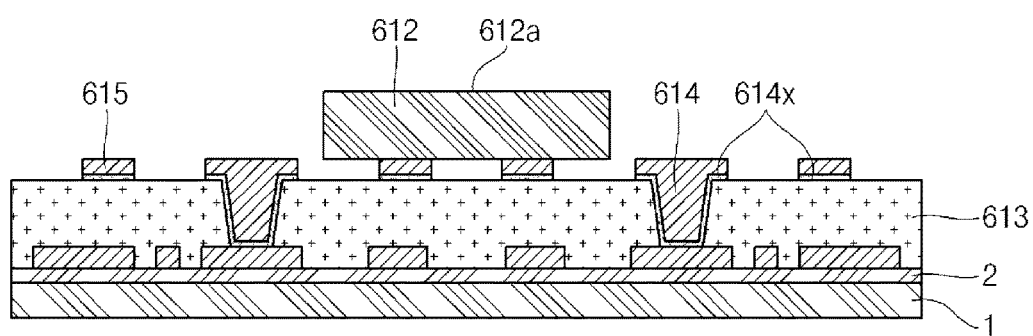

In the forming of the dummy pattern 612 on the third conductive patterns 615 illustrated in FIG. 6C, the dummy pattern 612 is formed to cover at least one of the third conductive patterns 615 formed on the first dielectric layer 613. The dummy pattern 612 may have a predetermined height. In addition, the dummy pattern 612 may be formed on the third conductive pattern 615, which is not connected to the first conductive via 614, among the third conductive patterns 615 formed on the first dielectric layer 613. The third conductive pattern 615 having the dummy pattern 612 becomes the second recess conductive pattern 615a provided in a recess portion of the substrate 610.

Figure 6D:
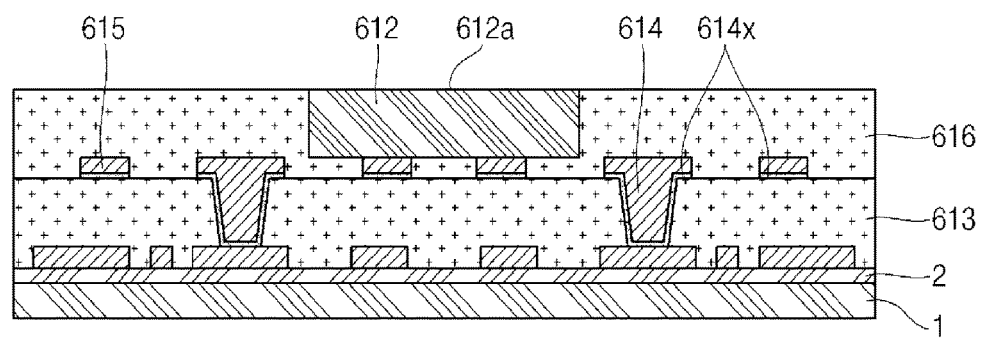

In the forming of the second dielectric layer 616 to cover the dummy pattern 612, the first conductive via 614 and the third conductive patterns 615 illustrated in FIG. 6D, the second dielectric layer 616 having a predetermined thickness is formed to cover the dummy pattern 612, the first conductive via 614, the third conductive patterns 615 and the first dielectric layer 613. Here, the first surface 612a of the dummy pattern 612 is exposed to the outside through the second dielectric layer 616. The second dielectric layer 616 may electrically protect the first conductive via 614 and the third conductive patterns 615. The second dielectric layer 616 may be made of one selected from the group consisting of a prepreg, a build-up film, a silicon oxide layer, a silicon nitride layer, and equivalents thereof, but aspects of the present disclosure are not limited thereto.

Figure 6E:
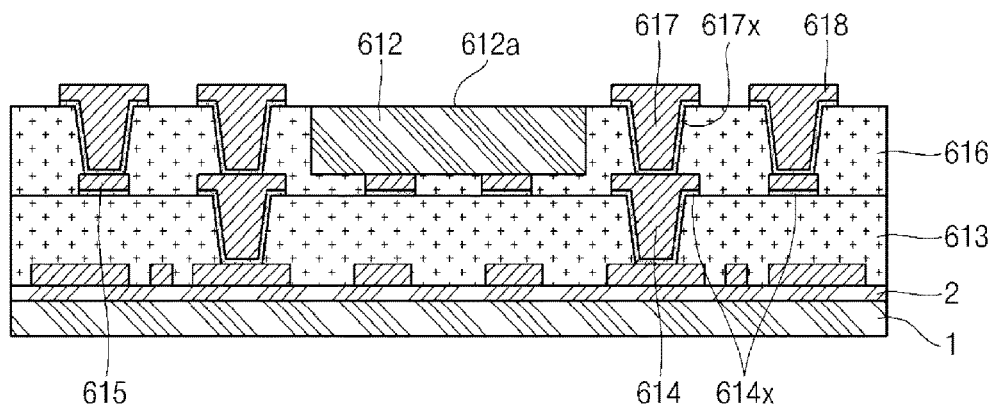

In the forming of the second conductive via 617 and the second conductive pattern 618 illustrated in FIG. 6E, a via hole is formed to expose the third conductive pattern 615 to the outside while passing through the second dielectric layer 616, the second conductive via 617 is further formed to fill at least a portion of the via hole, and the second conductive pattern 618 is then formed on the second dielectric layer 616 to be electrically connected to the second conductive via 617. The second conductive via 617 may be formed by forming a seed layer 617x to entirely cover the third conductive pattern 615 exposed to the outside through the via hole of the second dielectric layer 616 and sidewalls of the via hole and then performing electroplating on the seed layer 617x. The second conductive pattern 618 may be formed by forming the seed layer 617x on the second dielectric layer 616 and then performing electroplating on the seed layer 617x. In addition, the second conductive pattern 618 electrically connected to the second conductive via 617 may also be formed to partially extend along the exposed surface of the second dielectric layer 616 at the time of forming the second conductive via 617 through electroplating. That is to say, the seed layer 617x may be interposed between the second conductive via 617 and the second dielectric layer 616 and between the second conductive pattern 618 and the second dielectric layer 616.

Figure 6F:
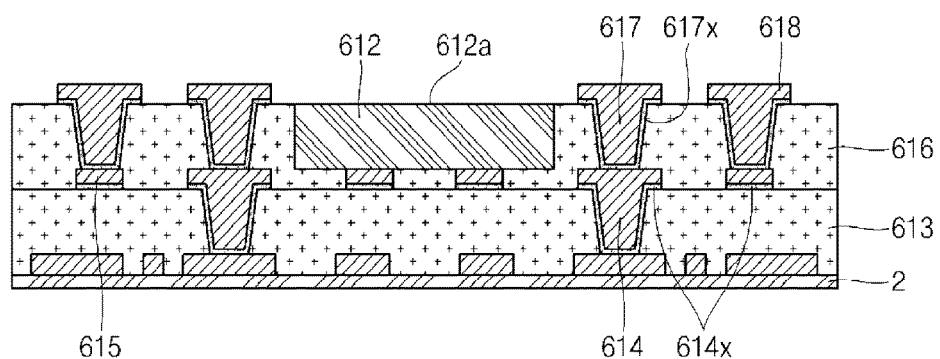

In the separating the carrier 1 from the seed layer 2 illustrated in FIG. 6F, the carrier 1 is separated from the seed layer 2 to expose the seed layer 2 to the outside. The carrier 1 is removed by general grinding and/or chemical etching or by UV or laser releasing, but aspects of the present disclosure are not limited thereto.

Figure 6G:
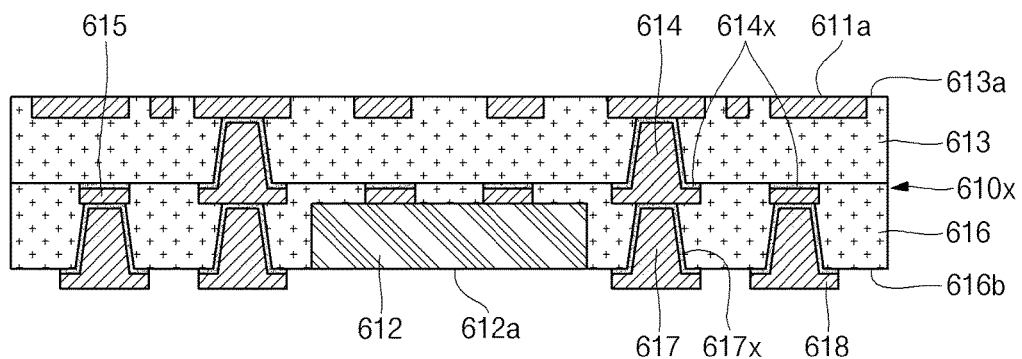

In the removing of the seed layer 2 from the illustrated in FIG. 6G, the substrate 610x from which the carrier 1 is separated is flipped and the seed layer 2 is then removed from the first dielectric layer 613, thereby exposing the first conductive pattern 611, the first dielectric layer 613 and the dummy pattern 612 to the outside. The first surface 613a of the first dielectric layer 613 and the first surface 611a of the first conductive pattern 611, which are exposed to the outside, may be coplanarly positioned (or coplanar). In addition, the second conductive pattern 618 formed on the second surface 616b of the second dielectric layer 616 may protrude from the second surface 616b of the second dielectric layer 616 on the substrate 610x. The seed layer 2 may be removed by general grinding and/or chemical etching, but aspects of the present disclosure are not limited thereto.

Figure 6H:
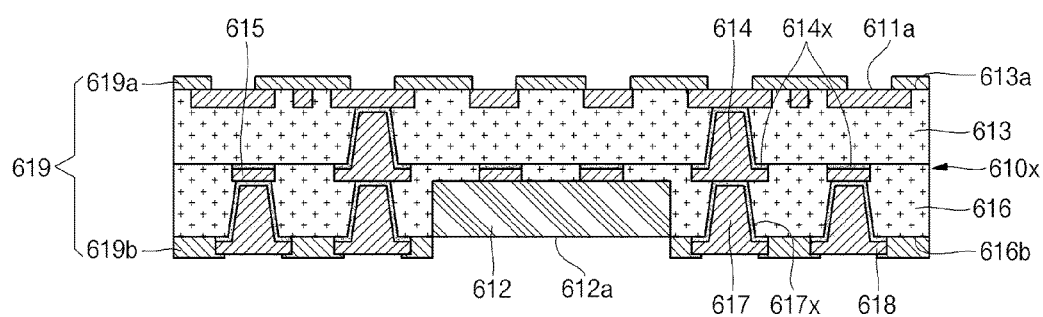

In the forming of the protection layer 619 on the dielectric layers 613 and 616 to expose the conductive patterns 611 and 618 illustrated in FIG. 6H, protection layers 619a and 619b are formed on the first surface 613a of the first dielectric layer 613 and the second surface 616b of the second dielectric layer 616, respectively. The protection layers 619a and 619b are formed to expose the first conductive pattern 611 exposed through the first surface 613a of the first dielectric layer 613 and the second conductive pattern 618 and the dummy pattern 612 exposed through the second surface 616b of the second dielectric layer 616. That is to say, the protection layers 619a and 619b are formed on the first surface 613a of the first dielectric layer 613 and the second surface 616b of the second dielectric layer 616, respectively, to expose the first conductive pattern 611, the dummy pattern 612 and the second conductive pattern 618 to the outside. The protection layers 619a and 619b may be made of a solder resist, but aspects of the present disclosure are not limited thereto.

Figure 6I:
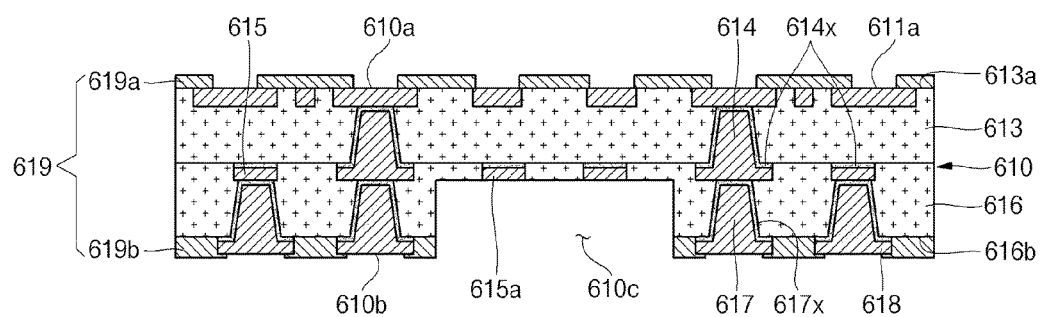

In the removing of the dummy pattern 612 from the dielectric layer 616 illustrated in FIG. 6I the dummy pattern 612 is removed, thereby forming the substrate 610 having the second recess portion 610c. The second recess conductive patterns 615a of the substrate 610 is exposed to the outside in the second recess portion 610c provided while the dummy pattern 612 is removed. The second recess conductive pattern 615a may be the third conductive pattern 615 having the dummy pattern 612 formed in the step illustrated in FIG. 6C. The dummy pattern 612 may be removed by etching, but aspects of the present disclosure are not limited thereto.

Figure 6J:
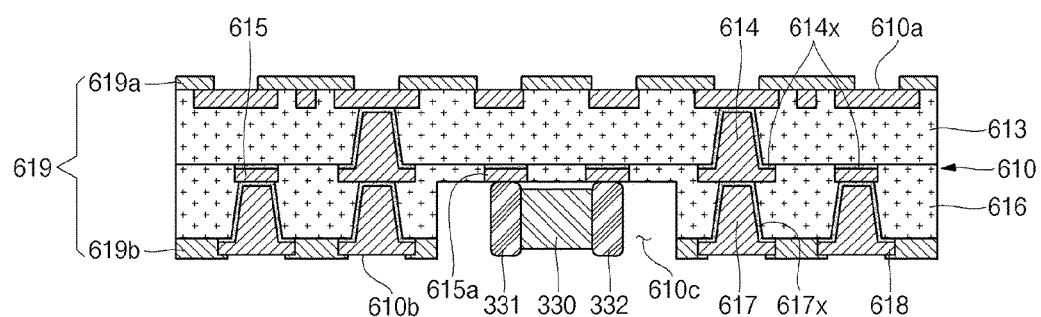

In the mounting the second passive element 330 on the substrate 610 illustrated in FIG. 6J, the second passive element 330 is mounted in the second recess portion 610c to be electrically connected to the second recess conductive pattern 615a provided in the second recess portion 610c. The second passive element 330 may include a first electrode 331 and a second electrode 332 and may be electrically connected to the first recess conductive patterns 615a. The second passive element 330 may include a resistor, a capacitor, an inductor, a connector, and the like, but aspects of the present disclosure are not limited thereto. The second passive element 330 is inserted into the second recess portion 610c, thereby preventing the overall thickness of the semiconductor package 600 from increasing.

Figure 6K:
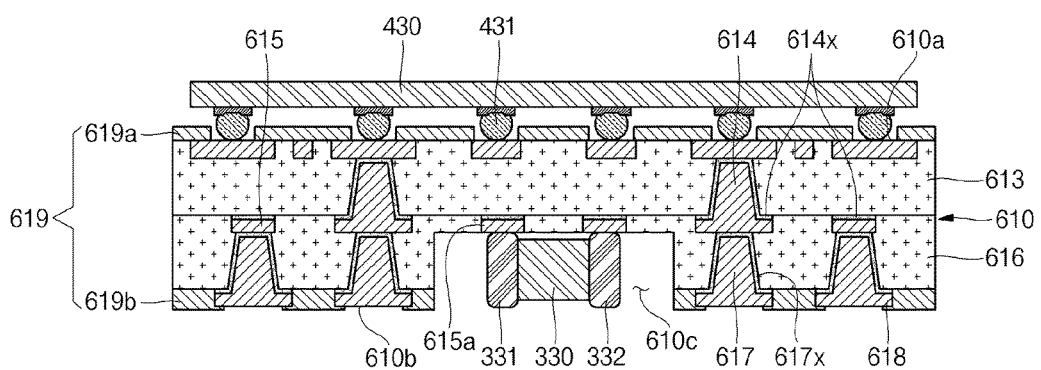

In the mounting of the semiconductor die 430 illustrated in FIG. 6K, the semiconductor die 430 is mounted on a first surface 610a of the substrate 610 to be electrically connected to the first conductive pattern 611 of the substrate 610. The mounting of the semiconductor die 430 illustrated in FIG. 6K may be the same as the mounting of the semiconductor die 430 illustrated in FIG. 4K.

Figure 6L:
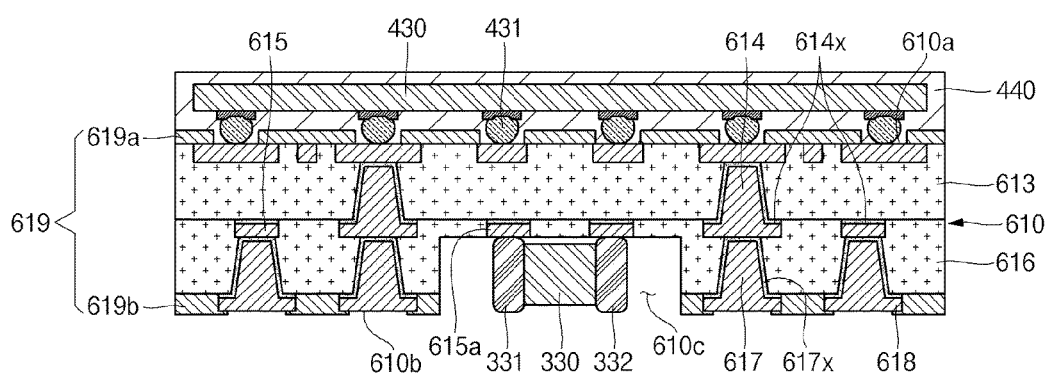

In the encapsulating illustrated in FIG. 6L, the encapsulating is performed to cover the first surface 610a of the substrate 610 and the semiconductor die 430 using the encapsulant 440. The encapsulant 440 may electrically protect the first surface 610a of the substrate 610 and the semiconductor die 430 from external circumferences.

Figure 6M:
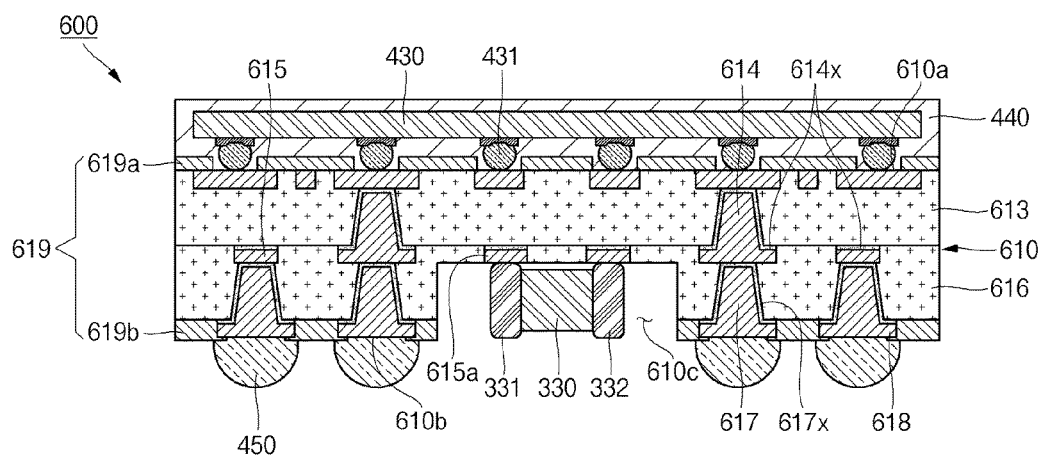

In the forming of the external conductive bump 450 illustrated in FIG. 6M, the external conductive bump 450 is formed to be electrically connected to the second conductive pattern 618 exposed to the second surface 610b of the substrate 610. The external conductive bump 450 is an output pad to serve to mount the semiconductor package 600 in an external board of an electronic device. The external conductive bump 450 may include a conductive pillar, a copper pillar, a conductive ball, a solder ball, or a copper ball, but aspects of the present disclosure are not limited thereto.

In the thus manufactured semiconductor package 600, the second passive element 330 is inserted into the second recess portion 610c of the substrate 610, thereby preventing the overall thickness of the semiconductor package 600 from increasing.

Referring to FIGS. 7A to 7F are cross-sectional views sequentially illustrating another manufacturing method of the substrate illustrated in FIG. 6I.

As illustrated in FIGS. 7A to 7F, the preparing of the substrate 610 may include forming the second dielectric layer 616 to cover the first conductive via 614 and the third conductive patterns 615, forming the second conductive via 617 and the second conductive pattern 618 on the second dielectric layer 616, separating the carrier 1 from the seed layer 2, removing the seed layer 2 from the first dielectric layer 613, forming a protection layer on the dielectric layers 613 and 616 to expose the first and second conductive patterns 611 and 618, and forming the second recess portion 610c on the second dielectric layer 616. The preparing of the substrate 610 is performed by forming the seed layer 2 on the carrier 1 illustrated in FIG. 4A, 6A or 6B, forming the first conductive pattern 611 using the seed layer 2, forming the first dielectric layer 613 to cover the first conductive pattern 611 and forming the first conductive via 614 and the third conductive patterns 615 on the first dielectric layer 613, and forming the second dielectric layer 616 illustrated in FIG. 7A.

Figure 7A:
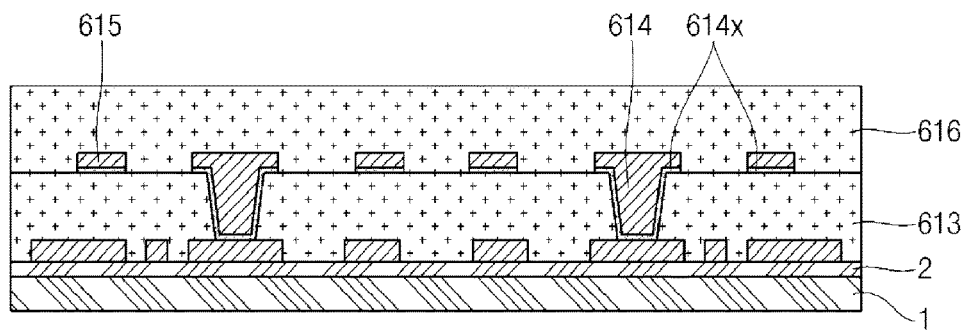
FIGS. 7A to 7F are cross-sectional views sequentially illustrating another manufacturing method of the substrate illustrated in FIG. 6I.

In the forming of the second dielectric layer 616 to cover the first conductive via 614 and the third conductive patterns 615 illustrated in FIG. 7A, second dielectric layer 616 having a predetermined thickness is formed to cover the first conductive via 614, the third conductive patterns 615 and the first dielectric layer 613. The second dielectric layer 616 may electrically protect the first conductive via 614 and the third conductive patterns 615. The second dielectric layer 616 may be made of one selected from the group consisting of a prepreg, a build-up film, a silicon oxide layer, a silicon nitride layer, and equivalents thereof, but aspects of the present disclosure are not limited thereto.

Figure 7B:
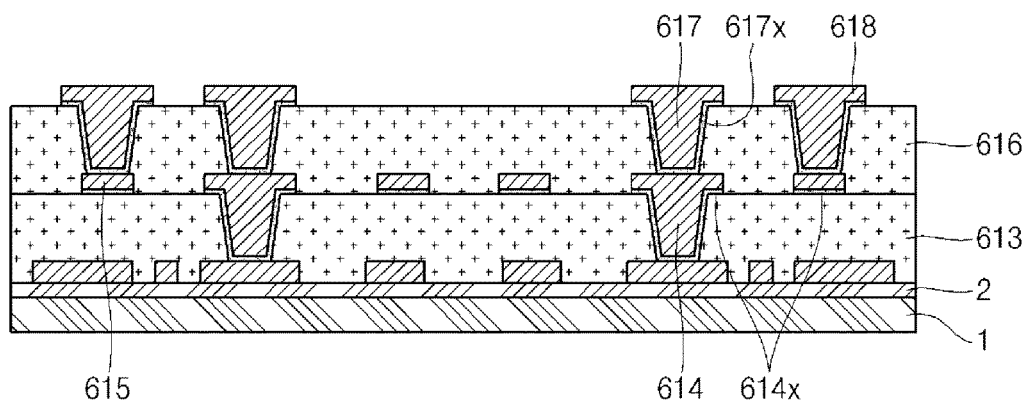

In the forming of the second conductive via 617 and the second conductive pattern 618 illustrated in FIG. 7B, a via hole may be formed to expose the third conductive pattern 615 to the outside while passing through the second dielectric layer 616, the second conductive via 617 may further be formed to fill at least a portion of the via hole, and the second conductive pattern 618 may then be further formed on the second dielectric layer 616 to be electrically connected to the second conductive via 617. The forming of the second conductive via 617 and the second conductive pattern 618 illustrated in FIG. 7B is the same as the forming of the second conductive via 617 and the second conductive pattern 618 illustrated in FIG. 6E.

Figure 7C:
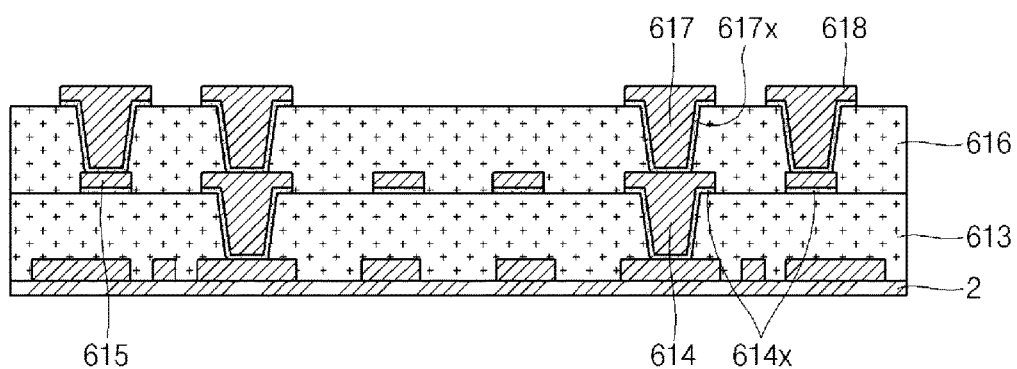

In the removing of the carrier 1 from the seed layer 2 illustrated in FIG. 7C, the carrier 1 is removed from the seed layer 2 to expose the seed layer 2 to the outside. The removing of the carrier 1 illustrated in FIG. 7C is the same as the removing of the carrier 1 illustrated in FIG. 6F.

Figure 7D:
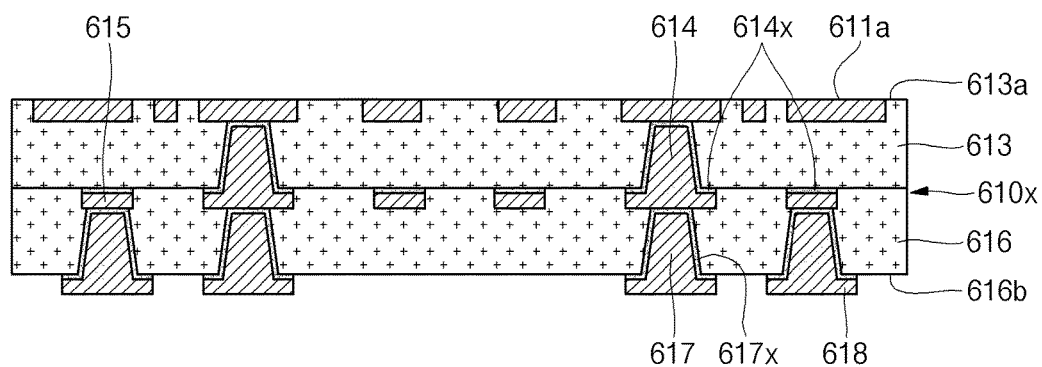

In the removing of the seed layer 2 from the first dielectric layer 613 illustrated in FIG. 7D, the substrate 610x from which the carrier 1 is separated is flipped and the seed layer 2 is then removed from the first dielectric layer 613, thereby exposing the first conductive pattern 611 and the first dielectric layer 613. The removing of the seed layer 2 illustrated in FIG. 7D is the same as the removing of the seed layer 2 illustrated in FIG. 6G.

Figure 7E:
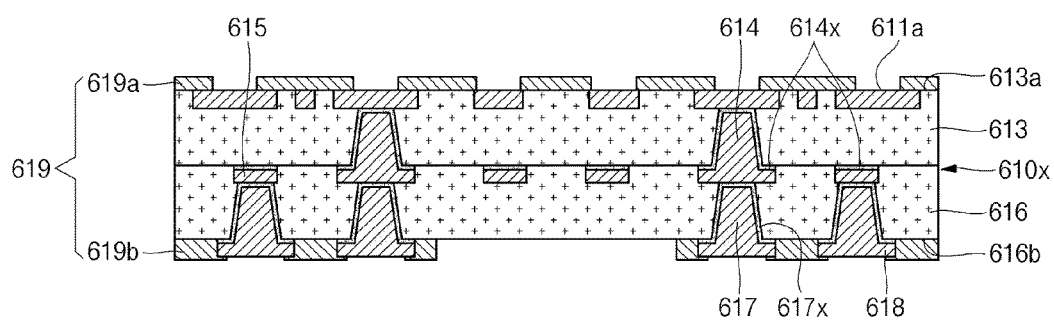

In the forming of the protection layer 619 on the dielectric layers 613 and 616 to expose the conductive patterns 611 and 618 illustrated in FIG. 7E, the protection layers 619a and 619b are formed on the first surface 613a of the first dielectric layer 613 and the second surface 616b of the second dielectric layer 616, respectively. The forming of the protection layer 619 illustrated in FIG. 7E is the same as the forming of the protection layer 619 illustrated in FIG. 6H.

Figure 7F:
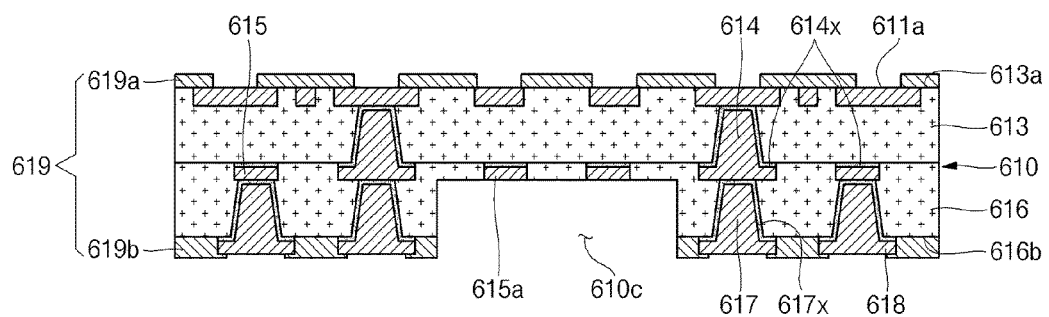

In the forming of the second recess portion 610c on the second dielectric layer 616 illustrated in FIG. 7F, the second recess portion 610c having a predetermined depth from the substrate 610 is formed on the second dielectric layer 616. The second recess portion 610c may be formed by removing a region of the second dielectric layer 616 having a predetermined height. The second recess portion 610c may be formed by photolithography and/or laser, but aspects of the present disclosure are not limited thereto. The substrate 610 has the second recess portion 610c as a recess having a predetermined depth in a direction ranging from the second surface 610b to the first surface 610a. The second recess portion 610c of the substrate 610 exposes at least one of the third conductive pads 623 to the outside in the second recess portion 610c. In addition, the third conductive pad 623 exposed to the outside through the second recess portion 610c may be the second recess conductive pattern 615a. That is to say, the second recess conductive pattern 615a is exposed to the outside in the second recess portion 610c.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor package and a method of manufacturing a semiconductor package. As a non-limiting example, various aspects of this disclosure provide a semiconductor package, and method of manufacturing thereof, that comprises a substrate having a first surface and a second surface opposite to the first surface, and comprising at least one first recess portion formed in a direction ranging from the first surface toward the second surface, a plurality of first recess conductive patterns formed in the first recess portion, and a first passive element inserted into the first recess portion of the substrate and having a first electrode and a second electrode electrically connected to the plurality of first recess conductive patterns. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor package comprising:
    a substrate comprising:
        a first substrate surface;
        a second substrate surface opposite the first substrate surface;
        a recess portion in the first substrate surface and extending toward the second substrate surface;
        a plurality of recess conductive patterns in the recess portion;
        a dielectric layer having a first dielectric surface and a second dielectric surface, wherein the recess portion extends from the first dielectric surface to the second dielectric surface;
        a first conductive pattern at the first dielectric surface;
        a second conductive pattern at the second dielectric surface; and
        a conductive via that passes through the dielectric layer and electrically connects the first conductive pattern and the second conductive pattern;
    a passive element positioned in the recess portion of the substrate and comprising a first electrode and a second electrode, each electrically connected to a respective pattern of the plurality of recess conductive patterns;
    a semiconductor die mounted on the first dielectric surface and connected to the first conductive pattern; and
    a layer of a single continuous encapsulating material that covers at least a first side and lateral sides of the passive element, and covers at least lateral sides of the semiconductor die and a first side of the semiconductor die facing away from the dielectric layer.

2. The semiconductor package of claim 1, wherein the substrate comprises a seed layer between the conductive via and the first conductive pattern and on a side surface of the conductive via.

3. The semiconductor package of claim 1, wherein the first dielectric surface and a surface of the first conductive pattern are coplanar.

4. The semiconductor package of claim 3, wherein the second conductive pattern extends outward from the second dielectric surface.

5. The semiconductor package of claim 1, wherein the first side of the passive element faces away from the substrate, and the first side of the passive element is lower than the first side of the semiconductor die.

6. The semiconductor package of claim 1, wherein the encapsulating material underfills the passive element.

7. The semiconductor package of claim 1, wherein no portion of the semiconductor die covers the recess portion or any other recess portion of the substrate.

8. The semiconductor package of claim 1, wherein a top surface of the first conductive pattern is coplanar with the first dielectric layer surface.

9. The semiconductor package of claim 1, comprising a conductive bump electrically coupled to the second conductive pattern, wherein at least a portion of the conductive bump is exposed to an outside of the semiconductor package.

10. The semiconductor package of claim 1, wherein a first end of the conductive via at the first conductive pattern is narrower than a second end of the conductive via at the second conductive pattern.

11. The semiconductor package of claim 1, comprising a seed layer, wherein the second conductive pattern is separated from the second dielectric surface by at least the seed layer, and the first conductive pattern directly contacts the first dielectric layer surface.

12. A semiconductor package comprising:
    a substrate comprising:
        a top substrate side;
        a bottom substrate side;

a first dielectric layer (DM) having a top DL1 side, a bottom DL1 side, and a DL1 aperture that extends from the top DL1 side to the bottom DL1 side;

a second dielectric layer (DL2) having a top DL2 side facing the bottom DL1 side, and a bottom DL2 side, wherein a covered portion of the top DL2 side is covered by the first dielectric layer and an exposed portion of the top DL2 side is exposed from the first dielectric layer through the DL1 aperture;

a first conductive pattern at the top DL1 side;

a second conductive pattern at the top DL2 side;

a recess conductive pattern at the exposed portion of the top DL2 side; and a recess portion bounded by lateral sides of the DL1 aperture and by the exposed portion of the top DL2 side;

a passive electronic component positioned in the recess portion of the substrate and comprising an electrode that is connected to the recess conductive pattern;

a semiconductor die mounted on the top DL1 side and positioned such that no portion of the semiconductor die covers the recess portion of the substrate; and a layer of a single continuous encapsulating material that covers at least a first side and lateral sides of the passive electronic component, and covers at least lateral sides of the semiconductor die and a first side of the semiconductor die that faces away from the first dielectric layer.

13. A semiconductor package comprising:

a substrate comprising:
  a top substrate side;
  a bottom substrate side;
  a first dielectric layer (DL1) having a top DL1 side, a bottom DL1 side, and a DL1 aperture that extends from the top DL1 side to the bottom DL1 side;
  a second dielectric layer (DL2) having a top DL2 side facing the bottom DL1 side, and a bottom DL2 side, wherein a covered portion of the top DL2 side is covered by the first dielectric layer and an exposed portion of the top DL2 side is exposed from the first dielectric layer through the DL1 aperture;
  a first conductive pattern at the top DL1 side;
  a second conductive pattern at the top DL2 side;
  a recess conductive pattern at the exposed portion of the top DL2 side; and
  a recess portion bounded by lateral sides of the DL1 aperture and by the exposed portion of the top DL2 side;

a passive electronic component positioned in the recess portion of the substrate and comprising an electrode that is connected to the recess conductive pattern;

a semiconductor die mounted on the top DL1 side and positioned such that no portion of the semiconductor die covers the recess portion of the substrate; and a layer of a single continuous encapsulating material that covers at least a first side and lateral sides of the passive electronic component, and covers at least lateral sides of the semiconductor die, wherein a top side of the passive electronic component, facing away from the substrate, is lower than a top side, facing away from the substrate, of the semiconductor die, and a top side of the layer of the single continuous encapsulating material is entirely planar.

14. The semiconductor package of claim 13, wherein only a portion of the passive electronic component is positioned in the recess portion of the substrate.

15. The semiconductor package of claim 12, wherein:
at least a portion of the first conductive pattern is embedded in the top DL1 side;
at least a portion of the second conductive pattern is embedded in the covered portion of the top DL2 side; and
at least a portion of the recess conductive pattern is embedded in the exposed portion of the top DL2 side.

16. The semiconductor package of claim 12, wherein the first and second dielectric layers are formed of at least one of: a pre-preg material, a build-up film, a silicon oxide layer, and a silicon nitride layer.

17. The semiconductor package of claim 12, wherein the layer of the single continuous encapsulating material underfills the passive electronic component.

18. The semiconductor package of claim 13, wherein the first side of the passive electronic component is the top side of the passive electronic component.

* * * * *

UNITED STATES PATENT AND TRADEMARK OFFICE
CERTIFICATE OF CORRECTION

PATENT NO. : 10,032,705 B2
APPLICATION NO. : 15/149141
DATED : July 24, 2018
INVENTOR(S) : Jae Ung Lee et al.

Page 1 of 1

It is certified that error appears in the above-identified patent and that said Letters Patent is hereby corrected as shown below:

In the Claims

In Claim 12, Column 19, Line 1, delete "a first dielectric layer (DM)" and insert -- a first dielectric layer (DL1) --.

Signed and Sealed this
Eleventh Day of December, 2018

Andrei Iancu
*Director of the United States Patent and Trademark Office*